United States Patent
Shi

(10) Patent No.: US 10,644,237 B2
(45) Date of Patent: May 5, 2020

(54) ARRAY SUBSTRATE FOR OLED DISPLAY DEVICE

(71) Applicant: Shenzhen China Star Optoelectronics Technology Co., Ltd., Shenzhen, Guangdong (CN)

(72) Inventor: Longqiang Shi, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 214 days.

(21) Appl. No.: 15/329,329

(22) PCT Filed: Jan. 13, 2017

(86) PCT No.: PCT/CN2017/071033
§ 371 (c)(1),
(2) Date: Oct. 23, 2017

(87) PCT Pub. No.: WO2018/023955
PCT Pub. Date: Feb. 8, 2018

(65) Prior Publication Data
US 2018/0337333 A1 Nov. 22, 2018

(30) Foreign Application Priority Data
Aug. 3, 2016 (CN) .......................... 2016 1 0630351

(51) Int. Cl.
*H01L 29/08* (2006.01)
*H01L 31/0232* (2014.01)
(Continued)

(52) U.S. Cl.
CPC ............ *H01L 51/00* (2013.01); *H01L 27/124* (2013.01); *H01L 27/1225* (2013.01);
(Continued)

(58) Field of Classification Search
CPC .......... H01L 29/41733; H01L 27/3276; H01L 27/12; H01L 27/3248; H01L 27/3258; H01L 27/3262; H01L 33/00; H01L 51/00
See application file for complete search history.

(56) References Cited

U.S. PATENT DOCUMENTS 6,614,057 B2 9/2003 Ahn
7,732,824 B2 * 6/2010 Konuma ............. H01L 27/3246
257/83

(Continued)

FOREIGN PATENT DOCUMENTS

CN 102884633 1/2013
CN 103794633 5/2014
(Continued)

OTHER PUBLICATIONS

Search Report and Written Opinion, dated Apr. 5, 2017, for International Application No. PCT/CN2017/071033.
(Continued)

*Primary Examiner* — Alonzo Chambliss

(57) ABSTRACT

Disclosed are an array substrate of an OLED display device and a method for manufacturing the same. Thin-film transistors having different functions can have different electrical properties. The array substrate includes a base substrate, a semiconductor layer, a first insulating layer, a first metal layer, a second insulating layer, a second metal layer, and a third insulating layer which are arranged sequentially from bottom to top. A plurality of driving units are formed on the array substrate, and each of the driving units comprises a first thin-film transistor and a second thin-film transistor.

10 Claims, 3 Drawing Sheets

(51) Int. Cl.

| | | |
|---|---|---|
| *H01L 51/40* | (2006.01) | |
| *H01L 21/00* | (2006.01) | |
| *H01L 51/00* | (2006.01) | |
| *H01L 27/12* | (2006.01) | |
| *H01L 27/32* | (2006.01) | |
| *H01L 33/00* | (2010.01) | |

(52) U.S. Cl.
CPC ...... *H01L 27/1288* (2013.01); *H01L 27/3248* (2013.01); *H01L 27/3258* (2013.01); *H01L 27/3262* (2013.01); *H01L 33/00* (2013.01)

(56) References Cited

U.S. PATENT DOCUMENTS

| | | | | |
|---|---|---|---|---|
| 8,987,719 B2* | 3/2015 | Moon | ................ | H01L 51/5296 |
| | | | | 257/40 |
| 10,068,955 B2* | 9/2018 | Jiang | ................. | H01L 27/3262 |
| 2015/0102343 A1* | 4/2015 | Park | ..................... | H01L 27/124 |
| | | | | 257/43 |
| 2015/0206929 A1* | 7/2015 | Sato | ....................... | H01L 27/32 |
| | | | | 257/40 |
| 2016/0005803 A1* | 1/2016 | Ryu | .................... | H01L 27/3248 |
| | | | | 257/40 |
| 2016/0063924 A1* | 3/2016 | Oh | ..................... | H01L 27/1229 |
| | | | | 345/690 |
| 2017/0317113 A1* | 11/2017 | Lv | .......................... | H01L 27/12 |

FOREIGN PATENT DOCUMENTS

| | | |
|---|---|---|
| CN | 105514118 | 4/2016 |
| CN | 106057825 | 10/2016 |

OTHER PUBLICATIONS

Office Action and Search Report, dated Jul. 4, 2017 for Chinese Patent Application No. 201610630351.X.

\* cited by examiner

ARRAY SUBSTRATE FOR OLED DISPLAY DEVICE

CROSS-REFERENCE TO RELATED APPLICATIONS

This application claims the priority of Chinese patent application CN201610630351.X, entitled "Array substrate of OLED display device and method for manufacturing the same" and filed on Aug. 3, 2016, the entirety of which is incorporated herein by reference.

FIELD OF THE INVENTION

The present disclosure relates to the technical field of display, and in particular, to an array substrate of an OLED display device and a method for manufacturing the same.

BACKGROUND OF THE INVENTION

With the development of display technologies, organic light-emitting diode (OLED) display technology gradually becomes mature and OLED display devices are increasingly used in different display fields.

A basic driving unit in an OLED display device is shown in FIG. 1. The driving unit comprises two thin-film transistors (TFT) and a storage capacitor Cst to form a 2T1C structure. A scanning signal Vgate is input to a gate of a first thin-film transistor, and a data signal Vdata is input to a source of the first thin-film transistor. A drain of the first thin-film transistor is connected to a gate of a second thin-film transistor. A source of the second thin-film transistor is connected to a digital power supply Vdd, and a drain thereof is connected to a digital ground Vss. The storage capacitor Cst is arranged between the gate of the second thin-film transistor and the source thereof. A light-emitting diode is connected in series between the drain of the second thin-film transistor and the digital ground Vss.

The first thin-film transistor functions as a switch. When the gate of the first thin-film transistor is turned on, a data signal is transmitted from the source of the first thin-film transistor to the drain thereof. That is, the data signal is transmitted to the gate of the second thin-film transistor. The second thin-film transistor plays a role of regulating grayscale of the light-emitting diode. Magnitude of a current flowing through the light-emitting diode is controlled by a voltage difference Vgs between the gate of the second thin-film transistor and the source thereof, and the voltage difference Vgs is maintained by the storage capacitor Cst.

For the first thin-film transistor and the second thin-film transistor which have different functions, electrical properties required are different. For the first thin-film transistor, it is required that a sub-threshold of an IdVg curve thereof is small, so that the first thin-film transistor can be turned on or turned off quickly. For the second thin-film transistor, it is required that a sub-threshold of an IdVg curve thereof is large, which is beneficial for grayscale debugging of an OLED. However, in existing OLED display devices, the manufacturing procedure and the structure of the first thin-film transistor are the same as those of the second thin-film transistor. Therefore, the requirements for different electrical properties of the first thin-film transistor and the second thin-film transistor cannot be met.

SUMMARY OF THE INVENTION

The present disclosure aims to provide an array substrate of an OLED display device and a method for manufacturing the same, so that thin-film transistors having different functions can have different electrical properties.

The present disclosure provides an array substrate of an OLED display device. The array substrate comprises a base substrate, a semiconductor layer, a first insulating layer, a first metal layer, a second insulating layer, a second metal layer, and a third insulating layer which are arranged sequentially from bottom to top. A plurality of driving units are formed on the array substrate. Each of the driving units comprises a first thin-film transistor and a second thin-film transistor. An active channel layer of the first thin-film transistor and an active channel layer of the second thin-film transistor are arranged on the semiconductor layer. A gate of the first thin-film transistor, and a source and a drain of the second thin-film transistor are arranged in the first metal layer. A gate of the second thin-film transistor, and a source and a drain of the first thin-film transistor are arranged in the second metal layer. The gate of the second thin-film transistor is connected to the drain of the first transistor.

Preferably, the gate of the second thin-film transistor and the drain of the first thin-film transistor are connected with each other to form an integrated structure.

Preferably, the active channel layer of the first thin-film transistor and the active channel layer of the second thin-film transistor are made of indium gallium zinc oxide.

Further, doping areas are formed at two ends of the active channel layer.

Further, in the second thin-film transistor; the source and the gate thereof are connected to the active channel layer through via holes running through the first insulating layer.

Further, in the first thin-film transistor, the source and the drain are connected to the active channel layer through via holes running through the first insulating layer and the second insulating layer.

Further, a transparent electrode layer is further formed on the third insulating layer. A pixel electrode arranged on the transparent electrode layer is connected to the drain of the second thin-film transistor through a via hole running through the second insulating layer and a via hole of the third insulating layer.

The present disclosure further provides a method for manufacturing the array substrate of an OLED display device. The method includes steps of:

forming a pattern of a semiconductor layer on a base substrate by a mask patterning procedure, wherein the pattern of the semiconductor layer includes patterns of an active channel layer of a first thin-film transistor and an active channel layer of a second thin-film transistor in each driving unit;

forming a pattern of a first insulating layer by a mask patterning procedure based on the pattern formed in a preceding step, wherein the pattern of the first insulating layer includes patterns of via holes in the second thin-film transistor;

forming doping areas in the active channel layer of the second thin-film transistor by a plasma doping procedure based on the pattern formed in a preceding step;

forming a pattern of a first metal layer by a mask patterning procedure based on the pattern formed in a preceding step, wherein the pattern of the first metal layer includes patterns of a gate of the first thin-film transistor, and a source and a drain of the second thin-film transistor;

forming a pattern of a second insulating layer by a mask patterning procedure based on the pattern formed in a preceding step, wherein the pattern of the second insulating layer includes patterns of via holes in the first thin-film transistor;

forming doping areas in the active channel layer of the first thin-film transistor by a plasma doping procedure based on the pattern formed in a preceding step;

forming a pattern of a second metal layer by a mask patterning procedure based on the pattern formed in a preceding step, wherein the pattern of the second metal layer includes patterns of a gate of the second thin-film transistor, and a source and a drain of the first thin-film transistor; and forming a pattern of a third insulating layer by a mask patterning procedure based on the pattern formed in a preceding step, wherein the pattern of the third insulating layer includes a pattern of a via hole of a pixel electrode.

The method further includes a step of forming a pattern of the transparent electrode layer by a mask patterning procedure based on the pattern formed in a preceding step. The pattern of the transparent electrode layer includes a pattern of a pixel electrode connected to the drain of the second thin-film transistor.

Preferably, the active channel layer of the first thin-film transistor and the active channel layer of the second thin-film transistor are made of indium gallium zinc oxide.

The present disclosure has following beneficial effects. In the array substrate of the OLED display device provided herein, both the first transistor and the second thin-film transistor have a top gate structure. The gate of the first thin-film transistor is arranged in the first metal layer. A distance between the gate of the first thin-film transistor and the active channel layer thereof is equal to a thickness of the first insulating layer. Therefore, a sub-threshold of the first thin-film transistor is relatively small, and the first thin-film transistor can be turned on or turned off quickly. The gate of the second thin-film transistor is arranged in the second metal layer. A distance between the gate of the second thin-film transistor and the active channel layer thereof is equal to a sum of the thickness of the first insulating layer and a thickness of the second insulating layer. Thus, a sub-threshold of the second thin-film transistor is relatively large, which is beneficial for a grayscale debugging thereof. Therefore, the array substrate of the OLED display device provided in the present disclosure enables the first thin-film transistor and the second thin-film transistor to have different electrical properties, thereby improving display qualities of the OLED display device.

Other features and advantages of the present disclosure will be further explained in the following description, and will partly become self-evident therefrom, or be understood through the implementation of the present disclosure. Objectives and advantages of the present disclosure will be achieved and obtained through structures specifically pointed out in the description, claims, and the accompanying drawings.

BRIEF DESCRIPTION OF THE DRAWINGS

In order to clearly explain the technical solution in embodiments of the present disclosure, a brief introduction is made to the accompanying drawings used in descriptions of the embodiments. In the drawings.

DETAILED DESCRIPTION OF THE EMBODIMENTS

The implementation manner of the present disclosure will be explained in detail below with reference to the accompanying drawings and the embodiments, so that one can fully understand how the present disclosure solves the technical problem and achieves the technical effects through the technical means, thereby implementing the same. It should be noted that, as long as there is no conflict, any of the embodiments and any of the technical features thereof can be combined with one another, and the technical solutions obtained therefrom all fall within the scope of the present disclosure.

The present embodiment provides an array substrate of an OLED display device and a method for manufacturing the same, which enables thin-film transistors having different functions to have different electrical properties so as to improve display qualities of the OLED display device.

The array substrate of the OLED display device provided in the embodiment of the present disclosure comprises a base substrate, a semiconductor layer, a first insulating layer, a first metal layer, a second insulating layer, a second metal layer, and a third insulating layer Which are arranged sequentially from bottom to top. Moreover, a plurality of driving units are formed on the array substrate, and each of the driving units comprises a first thin-film transistor and a second thin-film transistor.

Figure 1:
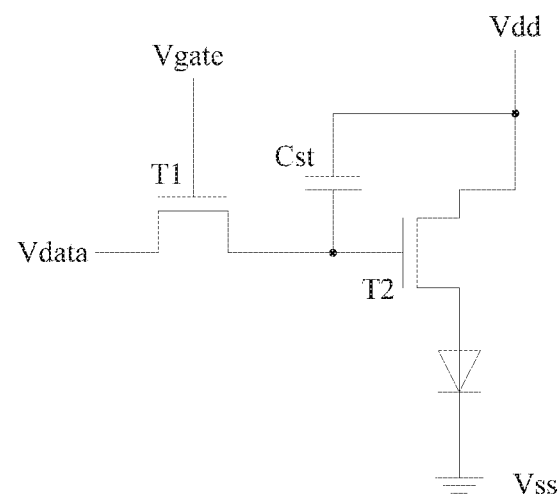
FIG. 1 shows a circuit of a driving unit in an OLED display device in the prior art.
Figure 2:
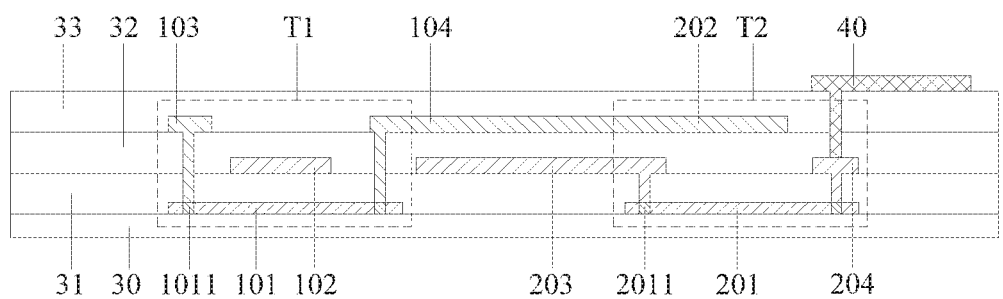
FIG. 2 is a sectional view of an array substrate of an OLED display device provided in an embodiment of the present disclosure.

As shown in FIG. 2, an active channel layer 101 of a first thin-film transistor T1 and an active channel layer 201 of a second thin-film transistor T2 are arranged on a semiconductor layer, and they are directly formed on a base (glass) substrate 30. The active channel layer 101 and the active channel layer 201 are covered by a first insulating layer 31.

A gate 102 of the first thin-film transistor T1, and a source 203 and a drain 204 of the second thin-film transistor T2 are arranged on a first metal layer. The first metal layer is covered by a second insulating layer 32.

A gate 202 of the second thin-film transistor T2, and a source 103 and a drain 104 of the first thin-film transistor T1 are arranged on a second metal layer. The second metal layer is covered by a third insulating layer 33. It can be seen from FIG. 2 that, the gate 202 of the second thin-film transistor T2 is connected to the drain 104 of the first thin-film transistor T1. As a preferred embodiment, the gate 202 of the second thin-film transistor T2 and the drain 104 of the first thin-film transistor T1 are connected with each other to form an integrated structure.

Besides, it can be seen from FIG. 2 that, both the gate 202 of the second thin-film transistor T2 and the drain 104 of the first thin-film transistor T1 have a relatively large area.

According to the present embodiment, the active channel layer 101 of the first thin-film transistor T1 and the active channel layer 201 of the second thin-film transistor T2 are made of indium gallium zinc oxide. Further, doping areas 1011 are formed at two ends of the active channel layer 101, and doping areas 2011 are formed at two ends of the active channel layer 201.

In the second thin-film transistor T2, the source 203 and the drain 204 are connected to the active channel layer 201 through via holes running through the first insulating layer 31. In the first thin-film transistor T1, the source 103 and the drain 104 are connected to the active channel layer 101 through via holes running through the first insulating layer 31 and the second insulating layer 32.

Further, a transparent electrode layer is formed on the third insulating layer 33. A pixel electrode 40 arranged on the transparent electrode layer is connected to the drain 204 of the second thin-film transistor T2 through a via hole running through the second insulating layer 32 and the third insulating layer 33.

A sub-threshold of a thin-film transistor is calculated by a following formula: $S=2.3\ kT(1+Cdm/Cox)/q$. In the formula, Cdm represents a dissipation capacitance, and Cox represents a capacitance per unit area of an insulating layer. Cox equals to C/d, in which C represents a permittivity of an insulating layer, and d represents a thickness of the insulating layer. Therefore, if a value of d becomes larger, a value of Cox becomes smaller, and a sub-threshold S becomes larger.

In the array substrate of the OLED display device provided herein, both the first thin-film transistor T1 and the second thin-film transistor T2 have a top gate structure. The gate 102 of the first thin-film transistor T1 is arranged in the first metal layer. A distance between the gate 102 and the active channel layer 101 is equal to a thickness of the first insulating layer 31. Therefore, a value of a Cox of the first thin-film transistor is relatively large, and a sub-threshold S of the first thin-film transistor is relatively small. Accordingly, the first thin-film transistor can be turned on or turned off quickly. The gate 202 of the second thin-film transistor T2 is arranged in the second metal layer. A distance between the gate 202 and the active channel layer 201 is equal to a sum of the thickness of the first insulating layer 31 and a thickness of the second insulating layer. Therefore, a value of a Cox of the second thin-film transistor is relatively small, and a sub-threshold S of the second thin-film transistor is relatively large, which is beneficial for a grayscale debugging thereof. Therefore, the array substrate of the OLED display device provided in the present embodiment enables the first thin-film transistor T1 and the second thin-film transistor T2 to have different electrical properties, thereby improving display qualities of the OLED display device.

The present embodiment further provides a method for manufacturing an array substrate of an OLED display device. The method includes following steps.

Figure 3A:
FIGS. 3a to 3h schematically show procedures for manufacturing an array substrate of an OLED display device provided in an embodiment of the present disclosure.

S1: as shown in FIG. 3a, a pattern of a semiconductor layer is formed on a base substrate 30 by a mask patterning procedure. The pattern of the semiconductor layer includes patterns of an active channel layer 101 of a first thin-film transistor and an active channel layer 201 of a second thin-film transistor in each driving unit.

Specifically, an IGZO layer is deposited on the base substrate by a physical vapor deposition (PVD) technology. Then, a wet etching is performed to the IGZO layer by a mask patterning procedure so as to form the pattern of the semiconductor layer. The pattern of the semiconductor layer includes the patterns of the active channel layer 101 of the first thin-film transistor and the active channel layer 201 of the second thin-film transistor.

Figure 3B:
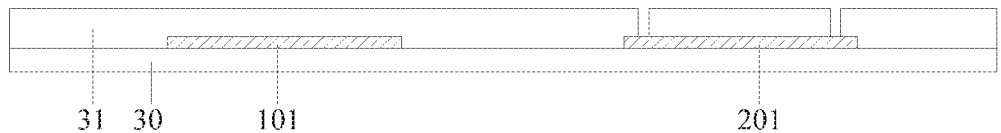
Figure 3C:
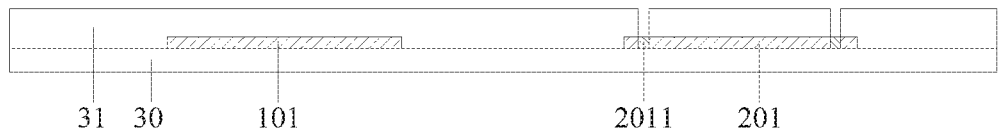

S2: as shown in FIG. 3b, a pattern of a first insulating layer 31 is formed by a mask patterning procedure based on the pattern formed in step S1. The pattern of the first insulating layer 31 includes patterns of via holes in the second thin-film transistor.

Specifically, the first insulating layer 31 is deposited on the base substrate and the semiconductor layer by a chemical vapor deposition (CVD) technology. Then, a dry etching is performed to the first insulating layer 31 by the mask patterning procedure so as to form the pattern of the first insulating layer 31. The pattern of the first insulating layer 31 includes the patterns of the via holes in the second thin-film transistor.

S3: as shown in 3c, doping areas 2011 in the active channel layer 201 of the second thin-film transistor are formed by a plasma doping procedure based on the pattern formed in step S2.

Specifically, a plasma doping treatment is performed to the active channel layer 201 through via holes in the second thin-film transistor so as to form the doping areas 2011 in the active channel layer 201.

Figure 3D:
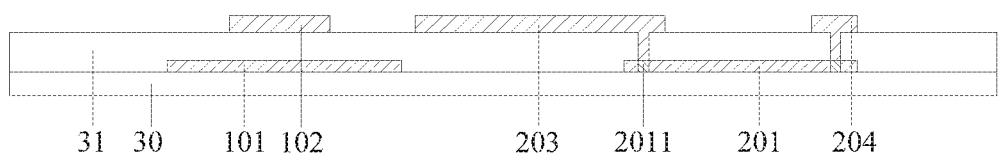
Figure 3E:
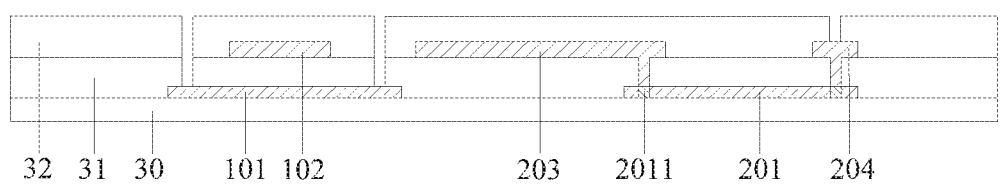
Figure 3F:
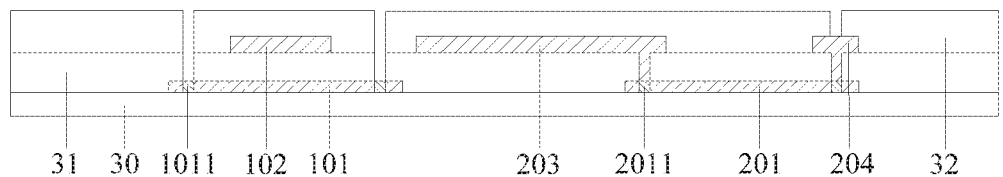

S4: as shown in FIG. 3d, a pattern of a first metal layer is formed by a mask patterning procedure based on the pattern formed in step S3. The pattern of the first metal layer includes patterns of a gate 102 of the first thin-film transistor, and a source 203 and a drain 204 of the second thin-film transistor.

Specifically, the first metal layer is deposited on the first insulating layer 31 by a PVD technology. Then, a wet etching is performed to the first metal layer by the mask patterning procedure so as to form the pattern of the first metal layer. The pattern of the first metal layer includes the patterns of the gate 102 of the first thin-film transistor, and the source 203 and the drain 204 of the second thin-film transistor.

S5: as shown in 3e, a pattern of a second insulating layer 32 is formed by a mask patterning procedure based on the pattern formed in step S4. The pattern of the second insulating layer 32 includes patterns of via holes in the first thin-film transistor.

Specifically, the second insulating layer 32 is deposited on the first metal layer and the first insulating layer 31 by a CVD technology. Then a dry etching is performed to the second insulating layer 32 by the mask patterning procedure to form the pattern of the second insulating layer 32. The pattern of the second insulating layer 32 includes the patterns of the via holes in the first thin-film transistor.

Since via holes in the first thin-film transistor run through both the first insulating layer 31 and the second insulating layer 32, a time duration of the dry etching in S5 should be longer than a time duration of the dry etching in S2.

S6: as shown in 3f, doping areas 1011 in the active channel layer 101 of the first thin-film transistor are formed by a plasma doping procedure based on the pattern formed in step S5.

Specifically, a plasma doping treatment is performed to the active channel layer 101 through via holes in the first thin-film transistor so as to form the doping areas 1011 in the active channel layer 101.

Figure 3G:
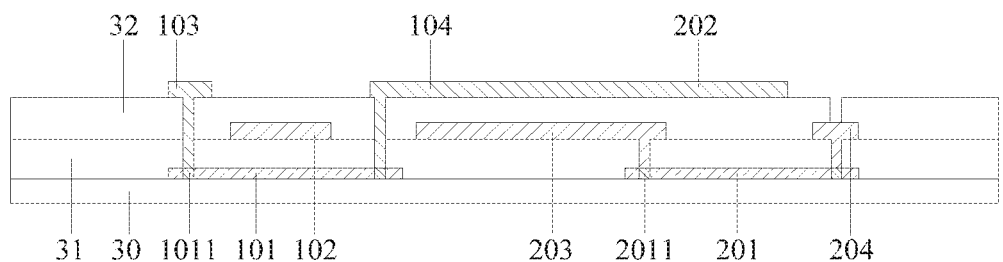

S7: as shown in FIG. 3g, a pattern of a second metal layer is formed by a mask patterning procedure based on the pattern formed in step S6. The pattern of the second metal layer include patterns of a gate 202 of the second thin-film transistor, and a source 103 and a drain 104 of the first thin-film transistor.

Specifically, the second metal layer is deposited on the second insulating layer 32 by a PVD technology. Then, a wet etching is performed to the second metal layer by the mask patterning procedure so as to form the pattern of the second metal layer. The pattern of the second metal layer includes the patterns of the gate 202 of the second thin-film transistor, and the source 103 and the drain 104 of the first thin-film transistor.

Figure 3H:
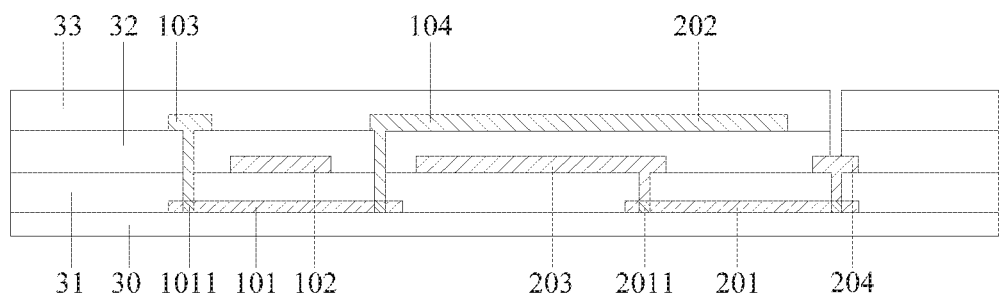

S8: as shown in FIG. 3h, a pattern of a third insulating layer 33 is formed by a mask patterning procedure based on the pattern formed in a step S7. The pattern of the third insulating layer 33 includes a pattern of a via hole of a pixel electrode.

Specifically, the third insulating layer 33 is deposited on the second metal layer and the second insulating layer 32 by a CVD technology. Then, a dry etching is performed to the third insulating layer 33 by the mask patterning procedure to form the pattern of the third insulating layer 33. The pattern of the third insulating layer 33 includes the pattern of the via hole of the pixel electrode.

Further, the method for manufacturing the array substrate provided herein further includes a following step.

S9: as shown in FIG. 2, a pattern of a transparent electrode layer is formed by a mask patterning procedure based on the pattern formed in step S8. The pattern of the transparent electrode layer includes a pattern of a pixel electrode 40 which is connected to the drain 204 of the second thin-film transistor.

Specifically, the transparent electrode layer is deposited on the third insulating layer 33 by a PVD technology. Preferably, the transparent electrode layer is made of indium tin oxide (ITO). Then, a wet etching is performed to the transparent electrode layer by the mask patterning procedure so as to form the pattern of the pixel electrode 40.

A particular structure of the array substrate provided in the embodiment of the present disclosure can be formed by the above steps. The first thin-film transistor and the second thin-film transistor can have different electrical properties, and the display qualities of the OLED display device can be improved.

Although embodiments of the present disclosure are provided as above, the above embodiments are described only for better understanding, rather than restricting the present disclosure. Anyone skilled in the art can make amendments to the implementing forms or details without departing from the spirit and scope of the present disclosure. The scope of the present disclosure should be subject to the scope defined in the claims.

The invention claimed is:

1. An array substrate of an OLED display device, comprising a base substrate, a semiconductor layer, a first insulating layer, a first metal layer, a second insulating layer, a second metal layer, and a third insulating layer which are arranged sequentially from bottom to top;
   wherein a plurality of driving units are formed on the array substrate, and each of the driving units comprises a first thin-film transistor and a second thin-film transistor;
   wherein an active channel layer of the first thin-film transistor and an active channel layer of the second thin-film transistor are arranged on the semiconductor layer;
   wherein a gate of the first thin-film transistor, and a source and a drain of the second thin-film transistor are arranged in the first metal layer;
   wherein a gate of the second thin-film transistor, and a source and a drain of the first thin-film transistor are arranged in the second metal layer; and
   wherein the gate of the second thin-film transistor is connected to the drain of the first thin-film transistor.

2. The array substrate according to claim 1, wherein the gate of the second thin-film transistor and the drain of the first thin-film transistor are connected with each other to form an integrated structure.

3. The array substrate according to claim 2, wherein doping areas are formed at two ends of the active channel layer.

4. The array substrate according to claim 1, wherein the active channel layer of the first thin-film transistor and the active channel layer of the second thin-film transistor are made of indium gallium zinc oxide.

5. The array substrate according to claim 1, wherein in the second thin-film transistor, the source and the drain are connected to the active channel layer through via holes running through the first insulating layer.

6. The array substrate according to claim 1, wherein in the first thin-film transistor, the source and the drain are connected to the active channel layer through via holes running through the first insulating layer and the second insulating layer.

7. The array substrate according to claim 1, wherein a transparent electrode layer is further formed on the third insulating layer; and
   wherein a pixel electrode arranged on the transparent electrode layer is connected to the drain of the second thin-film transistor through a via hole running through the second insulating layer and the third insulating layer.

8. A method for manufacturing an array substrate of an OLED display device,
   wherein the array substrate of the OLED display device comprises a base substrate, a semiconductor layer, a first insulating layer, a first metal layer, a second insulating layer, a second metal layer, and a third insulating layer which are arranged sequentially from bottom to top;
   wherein a plurality of driving units are formed on the array substrate, and each of the driving units comprises a first thin-film transistor and a second thin-film transistor;
   wherein an active channel layer of the first thin-film transistor and an active channel layer of the second thin-film transistor are arranged on the semiconductor layer;
   wherein a gate of the first thin-film transistor, and a source and a drain of the second thin-film transistor are arranged in the first metal layer; and
   wherein a gate of the second thin-film transistor, and a source and a drain of the first thin-film transistor are arranged in the second metal layer; and
   wherein the gate of the second thin-film transistor is connected to the drain of the first thin-film transistor; and
   wherein the method includes steps of:
   forming a pattern of a semiconductor layer on a base substrate by a mask patterning procedure, wherein the pattern of the semiconductor layer includes patterns of an active channel layer of a first thin-film transistor and an active channel layer of a second thin-film transistor in each driving unit;
   forming a pattern of a first insulating layer by a mask patterning procedure based on the pattern formed in a preceding step, wherein the pattern of the first insulating layer includes patterns of via holes in the second thin-film transistor;
   forming doping areas in the active channel layer of the second thin-film transistor by a plasma doping procedure based on the pattern formed in a preceding step;
   forming a pattern of a first metal layer by a mask patterning procedure based on the pattern formed in a preceding step; wherein the pattern of the first metal layer includes patterns of a gate of the first thin-film transistor, and a source and a drain of the second thin-film transistor;

forming a pattern of a second insulating layer by a mask patterning procedure based on the pattern formed in a preceding step, wherein the pattern of the second insulating layer includes patterns of via holes in the first thin-film transistor;

forming doping areas in the active Channel layer of the first thin-film transistor by a plasma doping procedure based on the pattern formed in a preceding step;

forming a pattern of a second metal layer by a mask patterning procedure based on the pattern formed in a preceding step, wherein the pattern of the second metal layer includes patterns of a gate of the second thin-film transistor, and a source and a drain of the first thin-film transistor; and forming a pattern of a third insulating layer by a mask patterning procedure based on the pattern formed in a preceding step, wherein the pattern of the third insulating layer includes a pattern of a via hole of a pixel electrode.

9. The method according to claim 8, further including a step of:

forming a pattern of a transparent electrode layer by a mask patterning procedure based on the pattern formed in a preceding step, wherein the pattern of the transparent electrode layer includes a pattern of a pixel electrode connected to the drain of the second thin-film transistor.

10. The method according to claim 8, wherein the active channel layer of the first thin-film transistor and the active channel layer of the second thin-film transistor are made of indium gallium zinc oxide.

* * * * *